(12) United States Patent
Hayashi et al.

(10) Patent No.: US 7,214,072 B1
(45) Date of Patent: May 8, 2007

(54) PUSHER OF IC CHIP HANDLER

(75) Inventors: Shintaro Hayashi, Yokohama (JP); Osamu Urakawa, Yokohama (JP); Mitsuo Koizumi, Fukushima (JP)

(73) Assignee: Daytona Control Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/261,586

(22) Filed: Oct. 31, 2005

(51) Int. Cl.
*H01R 12/00* (2006.01)

(52) U.S. Cl. .......................................... 439/73
(58) Field of Classification Search ................... 439/73, 439/70–71; 340/679, 754, 674, 757
See application file for complete search history.

(56) References Cited

U.S. PATENT DOCUMENTS

| | | | |
|---|---|---|---|
| 4,911,648 A | | 3/1990 | Yajima et al. |
| 5,285,946 A | * | 2/1994 | Tomigashi et al. ............. 228/9 |
| 5,951,720 A | * | 9/1999 | Arakawa et al. ............ 29/25.01 |
| 6,160,410 A | * | 12/2000 | Orso et al. ................... 324/757 |
| 6,384,734 B1 | | 5/2002 | Ohno et al. |
| 6,747,466 B2 | * | 6/2004 | Sugimoto et al. ........... 324/754 |
| 2002/0080041 A1 | | 6/2002 | Ohno et al. |

FOREIGN PATENT DOCUMENTS

| | | |
|---|---|---|
| EP | 0 350 576 A2 | 1/1990 |
| EP | 1 574 865 A1 | 9/2005 |
| WO | WO 2004/001952 A1 | 12/2003 |
| WO | WO 2004/011952 A1 | 2/2004 |

* cited by examiner

*Primary Examiner*—J. F. Duverne
(74) *Attorney, Agent, or Firm*—Nixon & Vanderhye P.C.

(57) ABSTRACT

A pusher of an IC chip handler has a pusher frame which is attached to a pusher main body to be driven by the IC chip handler and a plurality of pusher heads attached to the pusher frame. Each of the pusher heads comprises a holder which is held by the pusher frame. At least one spring post is freely protruded outward from the inside of the holder, and a compression spring has one end arranged under pressure to a spring receiving portion of the spring post. A spring push plate arranges the compression spring to the spring receiving portion of the spring post under pressure, and an adjusting member adjusts a compression force of the compression spring. A device holding unit is attached to an end of the spring post protruded outside of the holder.

5 Claims, 5 Drawing Sheets

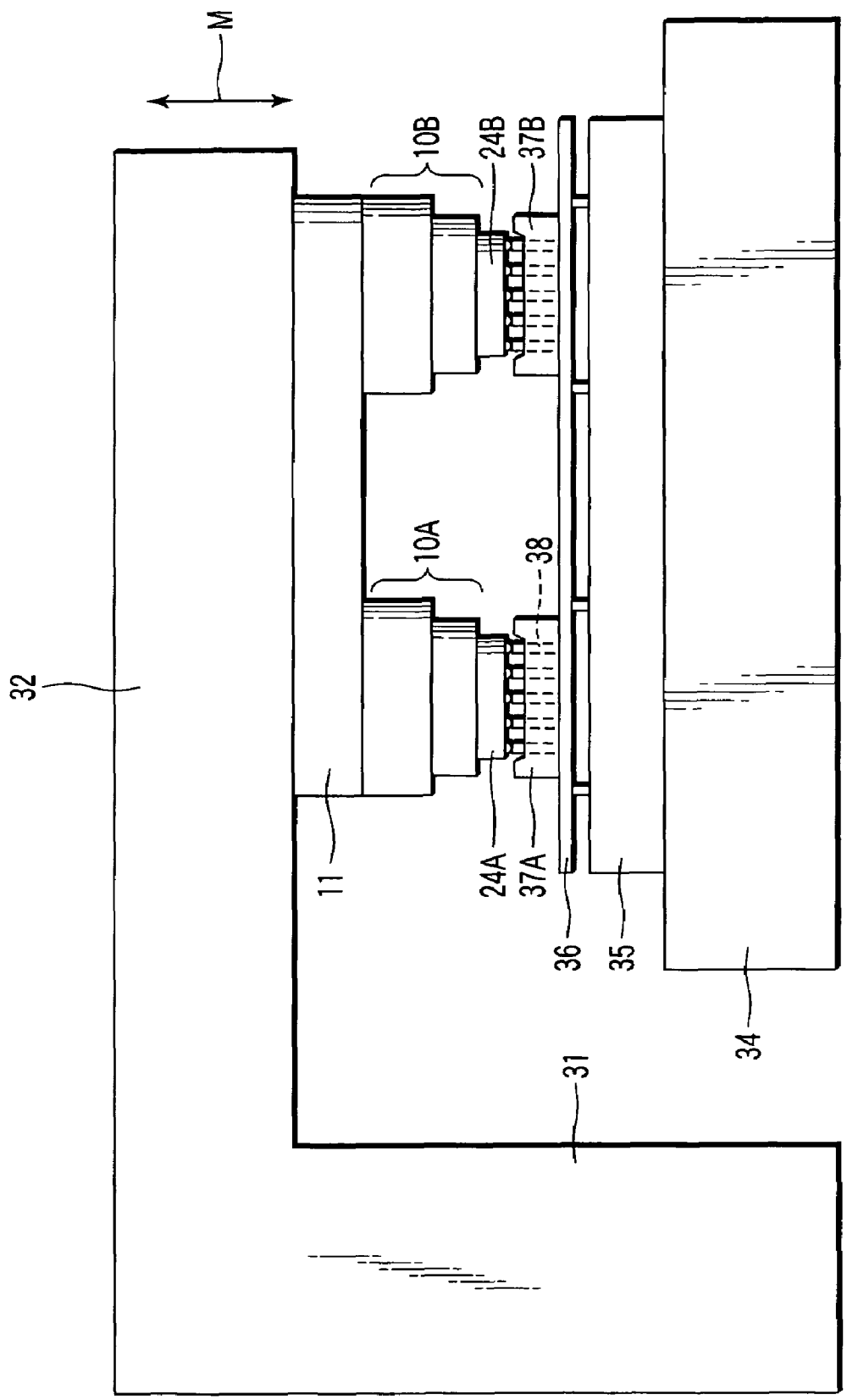
F I G. 3

PUSHER OF IC CHIP HANDLER

BACKGROUND OF THE INVENTION

1. Field of the Invention

The present invention relates to a pusher of an IC chip handler, and more specifically, to a pusher for testing a plurality of IC chips one by one or simultaneously.

2. Description of the Related Art

A plurality of pushers are used for testing a plurality of IC chips simultaneously. In this case, the plurality of IC chips to be tested simultaneously are selected from, for example, a single production lot, and therefore, the external dimensions thereof such as the thickness must have been formed evenly. However in practice, these IC chips have production errors in, for example, the thickness thereof. Further, as a terminal pin of an IC chip and a test pin of a socket, various kinds of terminals such as a solder ball terminal, a film-shaped terminal, a spring-shaped terminal, and a pogo pin terminal are employed. The height of these pins also has errors from a set value owing to production errors or changes by aging. Furthermore, a leaf spring or a coil spring, etc. is employed as a test pin of a socket to be set to contact terminal pins at a predetermined pressure when they are arranged under pressure. However, the elasticity of these springs also varies, and changes by aging, which leads to incomplete contact.

In general, when an IC chip is set onto a socket, a pusher goes down a preset distance and stops. If the dimensions of each IC chip and terminal pin are normal, the terminal pin of the IC chip normally contacts the test pin at the test device side by the pusher at this position, and the test is performed. In this case, for example, if the thickness of the IC chip is larger than a set range, the IC chip is pushed more than required by the pusher when the pusher goes down a preset distance, so that the terminal pin of the IC chip and the test pin of the socket may be deformed or damaged. In the case where the IC chip is thinner than the set value, a pushing pressure of the IC chip to the socket by the pusher becomes insufficient if the lowering distance of the pusher is the preset value, so that test cannot be performed normally owing to incomplete contact of the terminal pin.

Further, there is a case where a plurality of IC chips are tested simultaneously by use of a plurality of pushers. In this case, the lowering distance of the pusher corresponding to each socket is set evenly. Therefore, if there is an error in the dimensions of the IC chip and the terminal pin, the IC chip is pushed more than the standard value, for example, when the IC chip is thicker than the set value, so that nonconformities such as breakage may occur. When the IC chip is thinner than the set value, test results may become incorrect owing to incomplete contact of the terminal due to insufficient pressure setting.

In order to solve these problems with the prior art, various countermeasures have been made. However, there are various types of IC chips to be tested, and testing costs will become high if pushers corresponding to these various specifications of the IC chips are to be prepared, which is not practical. Therefore, the realization of a pusher which can be applied in common to IC chips of various specifications would be desirable.

BRIEF SUMMARY OF THE INVENTION

According to an aspect of the present invention, there is provided a pusher of an IC chip handler, comprising: a holder which is held at an end of a pusher main body to be driven by an IC handler; at least one spring post which is freely protruded outward from the inside of the holder; a compression spring whose one end is arranged under pressure to a spring receiving portion of the spring post; a spring push plate which arranges the compression spring to the spring receiving portion of the spring post under pressure; adjusting means for adjusting a compression force of the compression spring; and a device holding unit attached to an end of the spring post protruded to the outside of the holder.

According to the present invention, it is possible to easily adjust a pushing force at the moment when an IC chip attached to the front end of the pusher is pushed against a socket during testing. Further, it is possible to absorb the differences of compression distances due to differences of thickness in the IC chips or devices to be tested when a plurality of IC chips are tested simultaneously. As a consequence, it is possible to provide a pusher of an IC chip handler, which can be applied in common to IC chips of various specifications and can attain a simple structure and reduce testing costs, and further can attain precise testing results.

BRIEF DESCRIPTION OF THE SEVERAL VIEWS OF THE DRAWING

FIG. 3 is a schematic block diagram simply showing an entire configuration of an IC chip handler to which the pusher shown in FIG. 1 is attached;

DETAILED DESCRIPTION OF THE INVENTION

Figure 1:
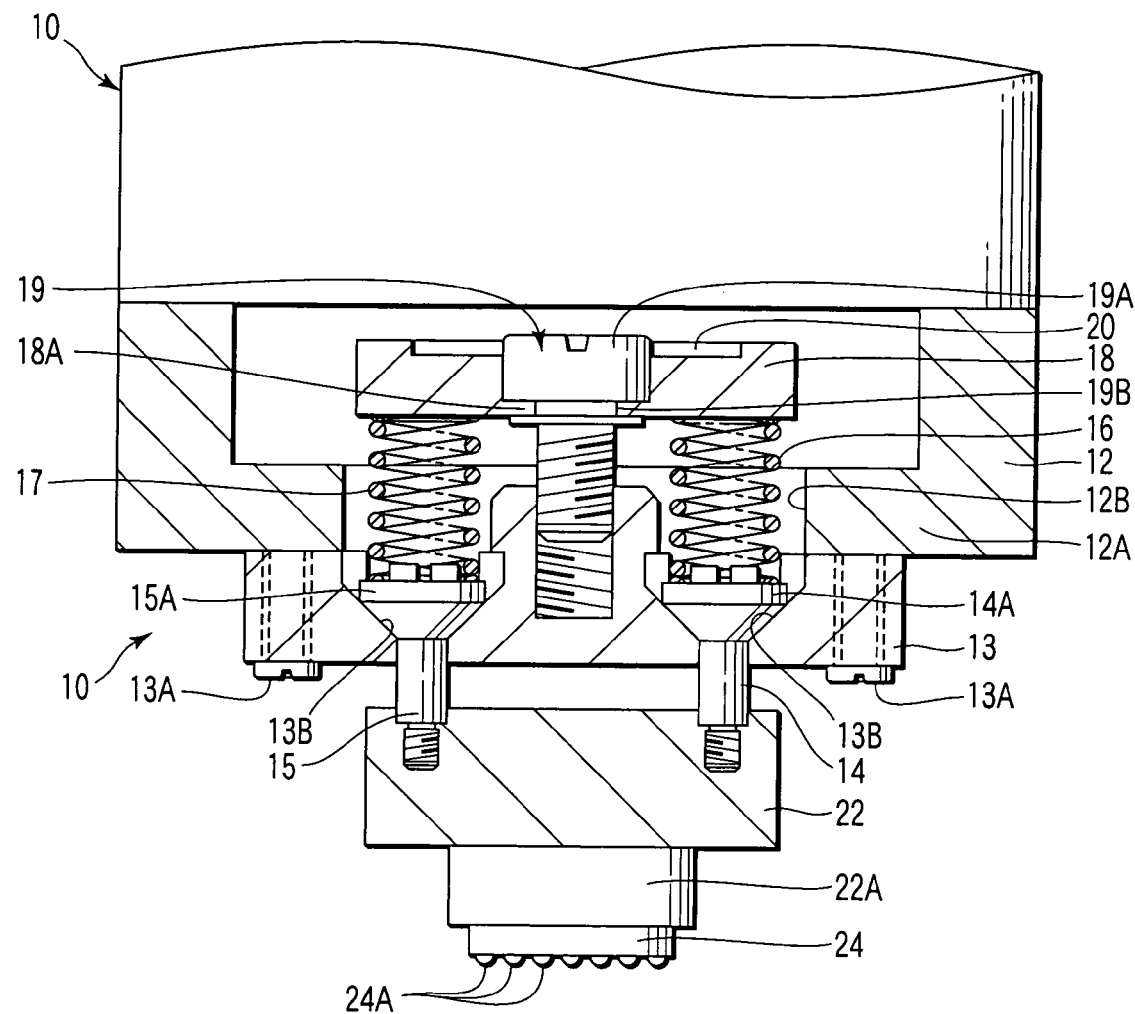
FIG. 1 is a cross sectional view showing a pusher according to an embodiment of the present invention.

In FIG. 1, a holder 12 of a cylindrical shape with a bottom as one of components configuring a pusher head 10 is held fixedly to an end of an arm head 11 (shown in FIG. 3) attached to a pusher arm to be driven by an IC handler. A circular hole 12B is formed at the central portion of a bottom 12A of the holder 12, and the circular hole 12B is blocked by a bottom plate 13 fixed to the outside of the bottom 12A with a plurality of screws 13A. The bottom plate 13 has a plurality of conical funnel shaped holes 13B formed from the inside thereof to the outside. Two conical funnel shaped holes 13B are formed in the bottom plate 13 in this embodiment, but three or more holes 13B may be formed.

Spring posts 14, 15 are inserted to the conical-shaped portions of the funnel-shaped holes 13B. The spring posts 14, 15 have conical-shaped portions corresponding to the conical shape holes 13B, and the ends thereof are protruded from the under surface of the bottom plate 13. Spring receiving portions 14A, 15A are formed in the bottoms of the conical-shaped portions of the spring posts 14, 15, and ends of compression springs 16, 17 are engaged to the receiving portions 14A, 15A, respectively. The other end of each of the compression springs 16, 17 is arranged to a spring push plate 18 under pressure. The spring push plate 18 is fixed rotatably to the upper portion of a spring force adjusting screw 19 screwed into the central portion of the bottom plate 13. For example, a slot 19B is formed in a head 19A of the spring force adjusting screw 19, and a flange 18A is formed in the spring push plate 18 so as to slide in the slot 19B.

Figure 2:
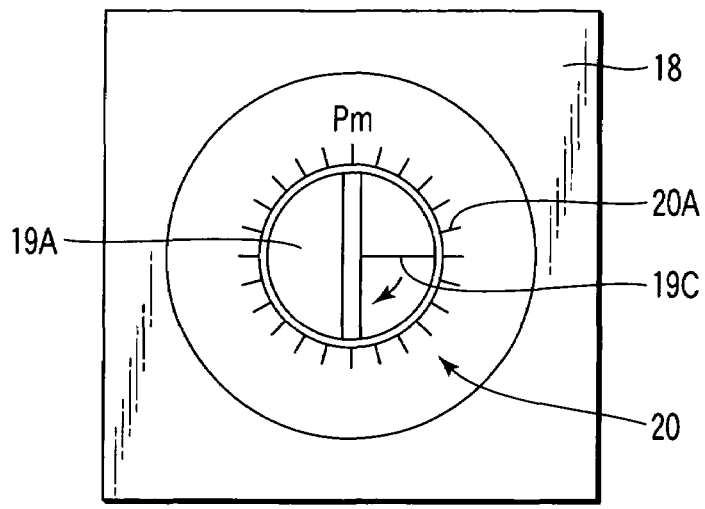
FIG. 2 is a plan view showing a device pushing force adjusting unit.

A disk-shaped scale plate 20 is engaged and fixed to a concave portion of the upper surface of the spring push plate 18, as shown in FIG. 2. On the inner diameter portion along the head of the screw 19 of the scale plate 20, a scale 20A for adjusting the spring force of the springs 16, 17 is inscribed. A pointer 19C is inscribed on the screw head 19A, and the pointer 19C moves along the scale 20A by the rotation of the screw 19 and displays the spring force or the total compression pressure of the springs 16, 17. The elasticity of the springs 16, 17 is set so as to apply substantially the same compression force to the spring posts 14, 15 respectively.

A disk-shaped scale plate 20 is engaged and fixed to a concave portion of the upper surface of the spring push plate 18, as shown in FIG. 2. On the inner diameter portion along the head of the screw 19 of the scale plate 20, a scale 20A for adjusting the spring force of the springs 16, 17 is inscribed. On the other hand, a pointer 19C is inscribed on the screw head 19A, and the pointer 19C moves along the scale 20A by the rotation of the screw 19 and displays the spring force or the total compression pressure of the springs 16, 17. Meanwhile, the elasticity of the springs 16, 17 is so set as to apply the substantially same compression force to the spring posts 14, 15 respectively.

The ends of the spring posts 14, 15 protruded from the under surface of the bottom plate 13 attached as a part of the holder 12 are screwed and fixed into a device holding plate 22. A device suction portion 22A is formed on the under surface of the device holding plate 22. In the device suction portion 22A, a vacuum suction hole which is coupled to, for example, a vacuum pump (not shown) provided in the handler via the pusher main body 11 is formed. At the time of testing, a device to be tested, for example, an IC chip 24 is sucked to the device suction portion 22A, and transferred to the socket at a test position. Meanwhile, there is described a case in which the terminals of the IC chip 24 are a plurality of solder balls 24A.

FIG. 3 is a block diagram schematically showing a configuration of a handler having two pieces of the pusher shown in FIG. 1 and a tester to be used for testing IC chips in connection with the handler. In FIG. 3, a pusher arm 32 of a handler 31 is configured to be driven in the vertical direction M at testing. A plurality of pusher heads, herein, two pusher heads 10A, 10B are mounted on the pusher arm 32 via an arm head 11. IC chips 24A, 24B are sucked to the pusher heads 10A, 10B, respectively.

FIG. 3 shows a configuration in the case of testing the IC chips 24A, 24B by use of the handler 31 and a tester 34. A tester head 35 is attached to the tester 34, and a socket holding plate 36 is fixed onto the tester head 35. Pogo pin type sockets 37A, 37B are attached onto the socket holding plate 36, and the IC chips 24A, 24B held by the pusher heads 10A, 10B are pushed to the sockets 37A, 37B. A plurality of pogo pins 38 are arranged two-dimensionally on the socket 37A such that the pin heads protruding from the socket 37A directly contact solder balls as terminal pins of the IC chip 24A. Each of the solder balls protrudes by a predetermined dimension from the under surface of the IC chip 24A, and the protrusion height may have an error more or less. The pogo pin 38 is of an elastic structure where the pin head thereof is instructed by a spring, and it is configured such that the height error of the solder ball is absorbed by the spring structure of the pogo pin 38. The other socket 37B is configured in the same manner as described above. The configuration of the pogo pin 38 is known to those skilled in the art, and therefore, further explanations thereof are omitted.

The pusher arm 32 is arranged, for example, at level, and the production dimensions of the arm head 11 and the pusher heads 10A, 10B attached to the under surface of the arm head 11 are precisely set. Thus, the dimension from the under surface of the pusher arm 32 to the end of the pusher head 10A is substantially the same as the dimension from the under surface of the pusher arm 32 to the end of the pusher head 10B at the level line L. In the same manner, the socket holding plate 36 attached onto the tester head 35 is arranged at level, and the distances from the upper surface of the socket holding plate 36 to the pin heads of the respective pogo pins 38 of the sockets 37A, 37B arranged thereon are set so as to be substantially the same.

Accordingly, if the thickness of the IC chip 24A to the base of the solder balls is substantially the same as the thickness of the IC chip 24B, the IC chip 24B is pushed to the socket 37B at substantially the same time as the IC chip 24A is pushed to the socket 37A by the lowering of the pusher arm 32 during testing, and the test by the tester 34 is performed to the IC chips 24A, 24B at substantially the same time.

Figure 5:
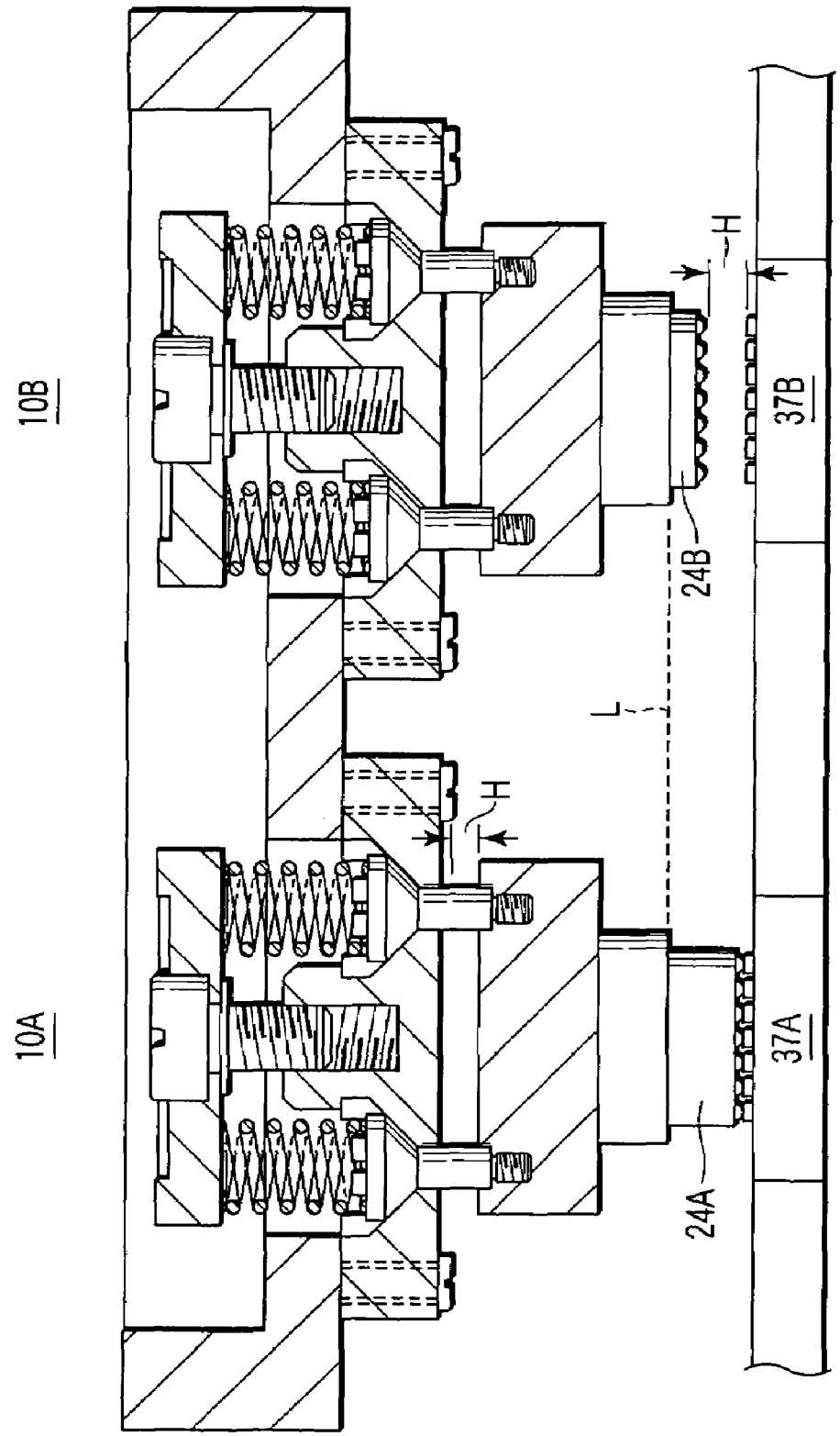
FIG. 5 is a cross sectional view showing a state before absorbing an error in IC chip thickness at the time of testing in correspondence to FIG. 3.
Figure 6:
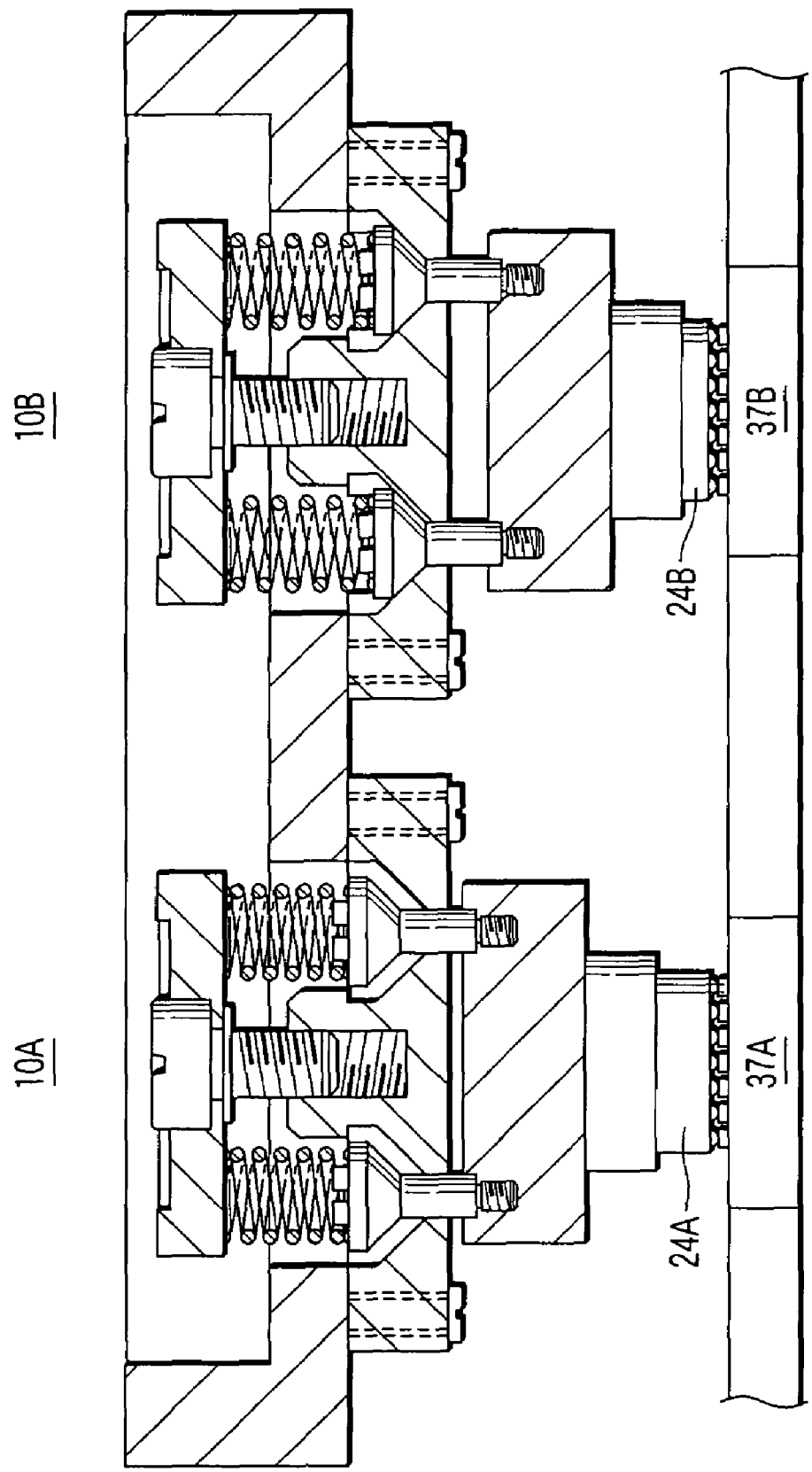
FIG. 6 is a cross sectional view showing a state in which an error in IC chip thickness has been absorbed in FIG. 5.

However, as shown in FIG. 5, for example, it is assumed that the IC chip 24A is, for example, 1 mm thicker than the IC chip 24B. Then, at the moment when the IC chip 24A is contacted to the socket 37A during testing, the IC chip 24B is still 1 mm before the socket 37B. The distance between the tip of the IC chip 24B and the socket 37B is denoted as H, in the figure. Accordingly, the pusher arm 32 is lowered further 1 mm or H mm, until the IC chip 24B is contacted to the socket 37B. At this moment, the IC chip 24A is pushed toward the socket 37B further from the first contact position. This state will be described and is shown in FIG. 6.

Herein, the comprehensive compression force of springs of the pogo pins 38 arranged two-dimensionally in the socket 37A is set larger than the total compression force of the springs (such as those 16, 17 shown in FIG. 1) that push downward the IC chip 24A in the pusher head 10A. For example, when the pusher head 10A is of the configuration shown in FIG. 1, the total compression force of the pusher head 10A becomes the total of the compression forces of the two springs 16, 17.

Consequently, when the pusher arm 32 goes down further 1 mm or from the position where the IC chip 24A contacts the socket 37A, the springs 16, 17 shown in FIG. 1 are compressed further 1 mm or H mm. In this state, the IC chip 24B is also pushed to the socket 37B, and, simultaneous test of the IC chips 24A, 24B becomes possible in this state, as shown in FIG. 6. However, in order to increase the reliability of testing results, it is desirable to, in practice, perform the test at a position to which the pusher arm 32 is lowered further by a predetermined distance.

Figure 4:
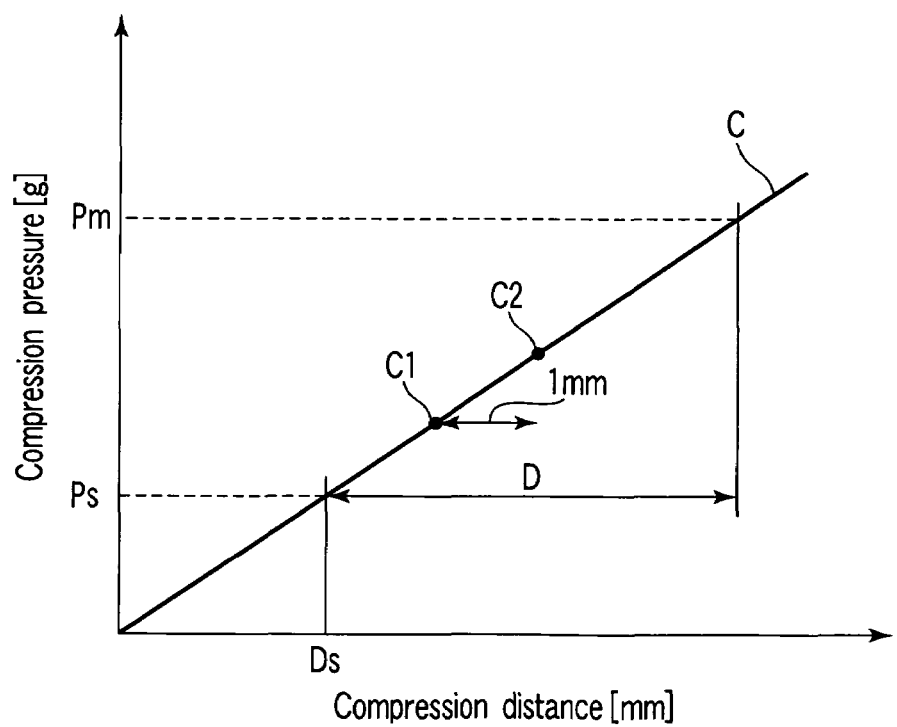
FIG. 4 is a graph showing a relation between a compression distance and a compression pressure of a compression spring shown in FIG. 1.

Herein, with reference to FIG. 4, an explanation will be given for the spring characteristic of the spring 16 shown in, for example, FIG. 1, in other words, the relation between the compression distance and the compression pressure at the time when the spring 16 is compressed, and in connection therewith, the operation of the spring force adjusting screw 19 shown in FIG. 1 will be explained. The spring 16 is a coil spring, and when the compression pressure thereof is 0 (g), the compression distance thereof is also 0 (mm). The spring 16 is set so as to be compressed 1 mm when pushed with a force of 1 g, for example. Accordingly, the more the pushing force increases, the more the compression distance increases along the straight line C. The spring 17 is formed in substantially the same manner as in the spring 16.

Hereinafter, the spring force adjusting screw 19 shown in FIG. 1 will be explained with reference to FIG. 4. Herein, since, in FIG. 1, two springs 16, 17 are used to one pusher head 10, the inclination of the spring characteristic curve C in FIG. 4 becomes half in practice. However, for convenience of explanations, it is assumed that FIG. 4 shows the comprehensive spring characteristic of the two springs 16, 17. In FIG. 1, when the springs 16, 17 are assembled between the spring push plate 18 and the spring posts 14, 15, the springs are compressed by only a compression distance Ds in FIG. 4 by turning the spring force adjusting screw 19. In this manner, the IC chip 24 is pushed downward with a pressure Ps by the springs 16, 17. The pressure Ps is set to such a value that, for example, in the case of the pusher head 10A in FIG. 3, the solder balls as the terminal pins of the IC chip 24A are pushed to the pogo pins 38 as the test pins of the socket 37A with an appropriate pressure, and a preferable contact is kept therebetween and no disadvantageous influence is given to the IC chip 24A. Further, the more the spring force adjusting screw 19 is fastened, the more the compression distance increases, and concurrently, the more the compression pressure becomes. At the compression distance Ds+D shown in FIG. 4, the compression pressure reaches an allowable maximum pressure Pm. At the allowable value Pm or less, the compression pressure is set such that there occurs no trouble such as breakage of the IC chip 24A by being pushed at the socket 37A.

For example, as shown in FIG. 2, the scale plate 20 is formed on the upper surface of the spring push plate 18, and the pressure pointer 19C is formed on the head portion of the spring force adjusting screw 19. Therefore, by entering the allowable value Pm on the scale plate 20, it is possible to set the compression pressure precisely by rotating the screw 19, and to easily check the allowable value Pm by visual inspection.

As described previously, it is assumed that, for example, the initial compression pressures of the respective compression springs of the pusher heads 10A, 10B are set to Ps. Herein, assuming that the IC chip 24A as the device to be tested is 1 mm thicker than the IC chip 24B, the spring of the pusher head 10A is compressed 1 mm more than the spring of the pusher head 10B. Accordingly, when the compression distance of the pusher head 10B at the time of an actual test is at point C1 on the curve C in FIG. 4, the compression distance of the pusher head 10A is at point C2 that is 1 mm more than the point C1.

In the pusher head 10 of the embodiment shown in FIG. 1, the configuration thereof is made so as to hold the IC chip 24 as the device to be tested by use of the two springs 16, 17. However, it is desirable that the IC chip 24 is held at level precisely, and the IC chip 24 is held at least at three points, for example, at four points. Thus, it is desirable that four springs are used to one pusher head in the same configuration as shown in FIG. 1.

Further, in the embodiment shown in FIG. 3, an explanation has been given for the case where two pusher heads 10A, 10B are attached onto one pusher arm 32, and thereby two IC chips 24A, 24B are tested at the same time. However, further more pusher heads may be attached to the pusher arm 32 via the arm head 11 to test more IC chips simultaneously.

Furthermore, in the embodiment in FIG. 3, the tester 34 including the sockets 37A, 37B is of substantially the same configuration as that of a commercially available tester. In addition, the arm head 11 may be applied to not only the pusher arm 32 of the handler 31, but also to many commercially available handlers merely through modification of the attachment structure thereof. Further, a plurality of pusher heads may be mounted directly to the pusher arm without using the arm head 11. Accordingly, the pusher according to the present invention is a general purpose pusher, and the application thereof is extremely wide, thereby reducing users' testing costs remarkably.

According to the present invention, it is possible to easily adjust the pushing force at the moment when the IC chip attached to the end of the pusher is pushed to the socket during testing. As a consequence, it is possible to provide a pusher of an IC chip handler, which can be applied in common to IC chips of various specifications and can attain a simple structure and reduce testing costs, and further can attain precise testing results.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pusher of an IC chip handler, comprising:
a holder which is held at an end of a pusher main body to be driven by an IC handler;
at least one spring post which is freely protruded outward from inside of the holder;
a compression spring with one end is arranged under pressure to a spring receiving portion of the spring post;
a spring push plate which arranges the compression spring to the spring receiving portion of the spring post under pressure;
adjusting means for adjusting a compression force of the compression spring; and
a device holding unit attached to an end of the spring post protruded outside of the holder,
wherein the adjusting means includes an adjusting screw which adjusts a distance between the spring push plate and the holder, thereby adjusting a compression distance of the spring, a scale formed on the spring push plate, and a pointer provided on the screw for indicating a rotation position of the adjusting screw in relation to the scale.

2. A pusher of an IC chip handler, having a pusher frame which is attached to a pusher main body to be driven by an IC handler, and a plurality of pusher heads which are attached to the pusher frame, wherein each of the pusher heads comprises:
a holder which is held by the pusher head;
at least one spring post which is freely protruded outward from inside of the holder;
a compression spring whose one end is arranged under pressure to a spring receiving portion of the spring post;
a spring push plate which arranges the compression spring to the spring receiving portion of the spring post under pressure;
adjusting means for adjusting a compression force of the compression spring; and
a device holding unit attached to an end of the spring post protruded outside of the holder,
wherein the adjusting means includes an adjusting screw which adjusts a distance between the spring push plate and the holder, thereby adjusting a compression distance of the spring, a scale formed on the spring push plate, and a pointer provided on the screw for indicating a rotation position of the adjusting screw in relation to the scale.

3. A pusher of an IC chip handler according to claim 1, wherein two spring posts are protruded outward from the holder; two compression springs are arranged between the spring push plate and the two spring posts, the elasticity of the two springs being set to apply substantially the same compression force to the two springs posts, respectively; and the device holding plate is fixed to ends of the two spring posts protruded outward from the holder and is provided with a device suction portion to hold the IC chip thereon.

4. A pusher of an IC chip handler according to claim 2, wherein each of the pusher heads comprises two spring posts protruded outward from the holder; and two compression springs arranged between the spring push plate and the two spring posts, the elasticity of the two springs being set to apply substantially the same compression force to the two spring posts, respectively; and wherein the device holding plate is fixed to ends of the two spring posts protruded outward from the holder, the device holding plate being provided with a device suction portion to hold the IC chip thereon, respectively.

5. A pusher of an IC chip handler, comprising:

a holder held at an end of a pusher main body to be driven by an IC handler;

at least one spring post freely protruded outward from inside of the holder;

a compression spring having one end arranged under pressure to a spring receiving portion of the spring post;

a spring push plate arranging the compression spring to the spring receiving portion of the spring post under pressure;

an adjusting assembly that adjusts a compression force of the compression spring; and a device holding unit attached to an end of the spring post protruded outside of the holder, wherein the adjusting assembly includes an adjusting screw which adjusts a distance between the spring push plate and the holder, thereby adjusting a compression distance of the spring, a scale formed on the spring push plate, and a pointer provided on the screw for indicating a rotation position of the adjusting screw in relation to the scale.

* * * * *